(12) United States Patent
Green et al.

(10) Patent No.: US 8,352,052 B1
(45) Date of Patent: Jan. 8, 2013

(54) ADJUSTING AUDIO VOLUME

(75) Inventors: Peter Green, Kirkland, WA (US); James Hart Shafer, Seattle, WA (US)

(73) Assignee: Adobe Systems Incorporated, San Jose, CA (US)

( * ) Notice: Subject to any disclaimer, the term of this patent is extended or adjusted under 35 U.S.C. 154(b) by 1224 days.

(21) Appl. No.: 11/585,765

(22) Filed: Oct. 23, 2006

(51) Int. Cl.
  *G06F 17/00* (2006.01)
(52) U.S. Cl. ............................................. 700/94
(58) Field of Classification Search ............... 700/94; 381/98–109, 94.8, 56, 58
  See application file for complete search history.

(56) References Cited

U.S. PATENT DOCUMENTS

| | | | | |
|---|---|---|---|---|
| 5,524,060 A | * | 6/1996 | Silfvast et al. | 381/104 |
| 5,987,407 A | * | 11/1999 | Wu et al. | 704/200.1 |
| 6,088,461 A | * | 7/2000 | Lin et al. | 381/104 |
| 7,526,348 B1 | * | 4/2009 | Marshall et al. | 700/94 |
| 2002/0090096 A1 | * | 7/2002 | Blind et al. | 381/104 |
| 2004/0138769 A1 | * | 7/2004 | Akiho | 700/94 |
| 2004/0264714 A1 | * | 12/2004 | Lu et al. | 381/104 |

* cited by examiner

*Primary Examiner* — Andrew C Flanders
(74) *Attorney, Agent, or Firm* — Fish & Richardson P.C.

(57) ABSTRACT

Systems, methods, and computer program products for editing audio data. In some implementations, a method is provided. The method includes receiving digital audio data and receiving a first input to a volume control to increase a volume of the audio data. The method further includes amplifying the audio data in response to the first user input without clipping the audio data and receiving one or more subsequent user inputs to the volume control, where in response to each subsequent user input performing compression and amplification of the audio data.

29 Claims, 4 Drawing Sheets

ADJUSTING AUDIO VOLUME

BACKGROUND

This specification relates to editing audio data.

Different visual representations of audio data are commonly used to display different features of the audio data. For example, an amplitude display shows a representation of audio intensity in the time-domain (e.g., a graphical display with time on the x-axis and intensity on the y-axis). Similarly, a frequency spectrogram shows a representation of frequencies of the audio data in the time-domain (e.g., a graphical display with time on the x-axis and frequency on the y-axis).

Audio data and digital audio data in particular can be edited. For example, digital audio data can be adjusted by a user to increase amplitude of the audio data (e.g., by increasing the overall intensity of the audio data). However, there is a maximum ceiling of amplitude that can be measured by a digital system. This is referred to as 0 decibels Full Scale ("0 dBFS"). If a portion of the audio data (e.g., a peak of the amplitude waveform of the audio data) is amplified beyond the ability of the system to measure (e.g., beyond 0 dBFS), the audio data is typically clipped at the maximum amplitude level, resulting in distortion of the audio data. Clipping results in a normally rounded peak of an audio waveform being squared at the maximum amplitude. In conventional digital signal processing, if audio data becomes clipped due to processing and is saved as clipped, the audio data will remain clipped even if played on an output device capable of supporting the unclipped audio data.

SUMMARY

Systems, methods, and computer program products for editing audio data. In general, in one aspect, a method and a computer program product, respectively, are provided. The method and computer program product include receiving digital audio data, receiving a first input to a volume control to increase a volume of the audio data, amplifying the audio data in response to the first input without clipping the audio data, and receiving one or more subsequent inputs to the volume control, where in response to each subsequent input performing compression and amplification of the audio data.

Implementations can include one or more of the following features. The performed compression can be dynamic range compression. The dynamic range compression can include compressing portions of the audio data exceeding a threshold amplitude level and not compressing the remaining portions of the audio data and the amplification can amplify the audio data following compression without clipping the audio data. The combination of compression and amplification operations can include limiting, where limiting includes amplifying the audio data and then compressing portions of the audio data exceeding a threshold amplitude level and not compressing the remaining portions of the audio data. The volume control can be a single button of an audio editing interface. Amplifying the audio data in response to the first input includes normalizing the audio data can include amplifying the audio data to a predetermined threshold level without clipping. The predetermined level can be a maximum amplification that can be achieved without clipping. The inputs can be user inputs.

The method and computer program product can further include scanning the audio data prior to performing normalization to identify amplitude peaks in the audio data. The method and computer program product can further include providing a user interface, the user interface displaying a visual representation of the audio data and including one or more controls allowing user manipulation of the audio data. Providing the user interface can further include updating the visual representation of the audio data following each input to reflect the amplified audio data. The displayed visual representation can be an amplitude waveform.

In general, in one aspect, a method and a computer program product, respectively, are provided. The method and computer program product include receiving digital audio data and receiving an input to adjust the amplitude of the audio data. Where in response to the user input amplifying the audio data without clipping and determining when a threshold amplitude level of the audio data is reached by a portion of the audio data. If the threshold amplitude level has been reached, performing limiting, the limiting including amplifying the audio data by a predefined amount and compressing portions of the audio data exceeding the threshold amplitude level and not compressing the remaining portions of the audio data.

Implementations of the method and computer program product can include one or more of the following features. The user input can include adjusting a sliding volume control in an audio editing interface. Determining when a threshold amplitude level is reached can include monitoring peak amplitude levels of the audio data for a maximum amplitude level. The maximum amplitude level can be a maximum amplification that can be achieved without clipping. The change from amplification to limiting can be automatically performed in response to a user input that would result in clipped audio data.

In general, in one aspect, a system is provided. The system includes a user interface device and one or more computers operable to interact with the user interface device. The one or more computer are further operable to receive digital audio data, receive a first input to a volume control to increase a volume of the audio data, amplify the audio data in response to the first input without clipping the audio data, and receive one or more subsequent inputs to the volume control, where in response to each subsequent input perform compression and amplification of the audio data.

Implementations of the system can include one or more of the following features. The one or more computers can include a server operable to interact with the user interface device through a data communication network, and the user interface device can be operable to interact with the server as a client. The user interface device can include a personal computer running a web browser or a mobile telephone running a wireless application protocol (WAP) browser. The one or more computers can include one personal computer, and the personal computer comprises the user interface device.

Particular embodiments of the subject matter described in this specification can be implemented to realize one or more of the following advantages. A user can increase a perceived volume of audio data simply and without specialized audio knowledge. Both amplification and dynamic range compression can automatically be performed as appropriate in response to a user input to a single audio editing tool. As a result, the user can simply increase the perceived volume without generating audio distortions that can result from incorrect manual application of different editing tools. Furthermore, users can quickly perform volume adjustments without multiple steps using different editing tools.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
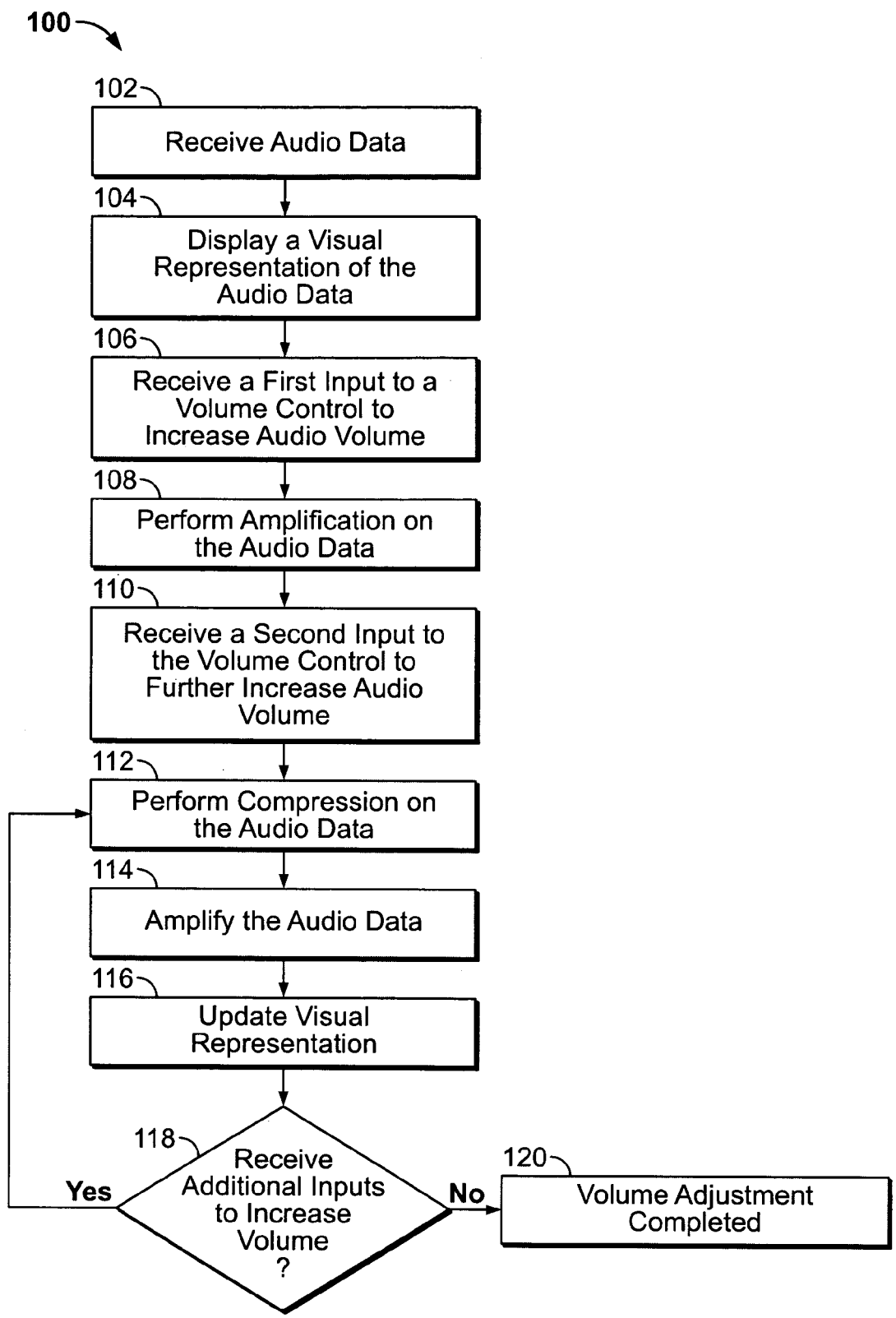
FIG. 1 shows an example process for adjusting perceived audio volume.

FIG. 1 shows an example process 100 for adjusting perceived audio volume. For convenience, the process will be described with reference to a computer system that performs the process. The system receives audio data, particularly digital audio data (step 102). The audio data is received, for example, as part of an audio file (e.g., a WAV, MP3, or other audio file format). The audio file can be locally stored or retrieved from a remote location. The audio data can be received, for example, in response to a user selection of a particular audio file.

The system displays a visual representation of the audio data (step 104). For example, a particular feature of the audio data can be plotted and displayed in a window of a graphical user interface. The visual representation can be displayed to show a number of different features of the audio data. For example, visual representation can be a frequency spectrogram, an amplitude waveform, a pan position plot, or a phase display. In some implementations, the visual representation is an amplitude waveform. The amplitude waveform shows audio intensity (i.e., amplitude) in the time-domain (e.g., a graphical display with time on the x-axis and intensity on the y-axis).

Figure 2:
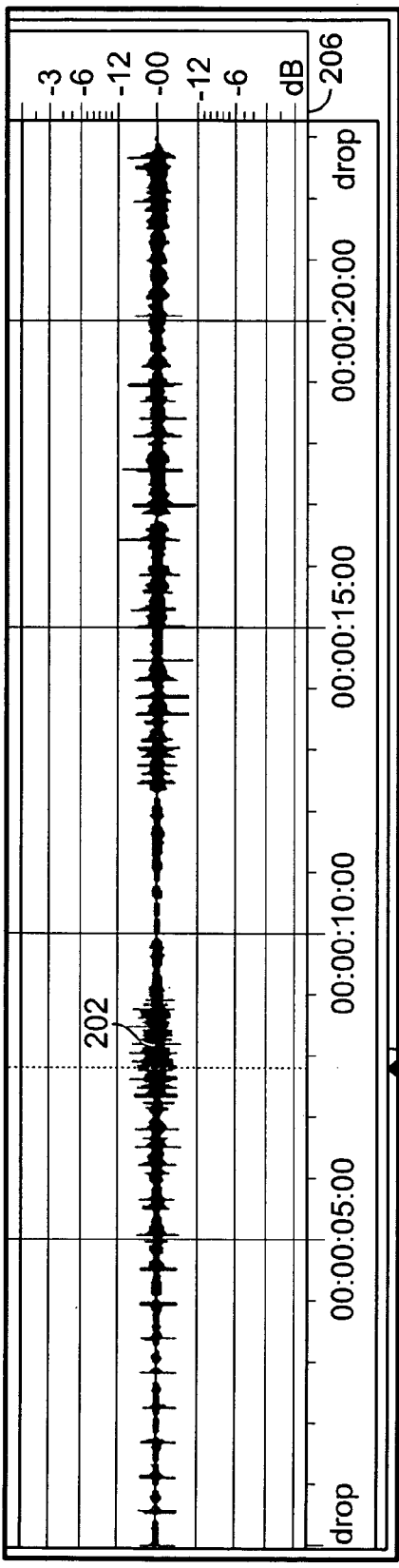
FIG. 2 shows an example display of an amplitude waveform prior to adjusting the perceived audio volume.

FIG. 2 shows a display 200 generated by the system from the audio data and displayed on a display device. The display 200 shows the overall intensity of the audio data in the time-domain. In particular, the display 200 shows amplitude waveform 202. For convenience a single audio channel display is shown, however, a multi-channel display can also be provided (e.g., for stereo audio data). With respect to the amplitude waveform 202, the y-axis 206 of the display 200 represents intensity, for example, in decibels. The x-axis 208 of the display 200 represents time, for example, in seconds.

In some implementations of the display 200, the user can zoom in or out of either axis of the display 200 independently. Zooming allows the user to examine particular portions of the visual representation, e.g., particular peaks of the amplitude waveform 202, over a particular time range. The user can zoom in or out of each axis to modify the scale of the axis, increasing or decreasing the range of values for the displayed visual representation. The visual representation of the amplitude waveform 202 changes to correspond to the selected zooming range. For example, a user can zoom in to display the audio data corresponding to a small time range of only a few milliseconds in order to see the detailed structure of the amplitude waveform 202. Alternatively, the user can zoom out in order to display the entire amplitude waveform 202 for the audio data.

As shown in FIG. 1, a first input (e.g., a user input) to a volume control is received to increase a volume of the audio data (step 106). For example, the displayed visual representation can be part of an audio editing interface. The audio editing interface can include one or more tools that provide access to different audio editing processes that can be performed on the audio data. The editing tools can allow a user to edit the audio data using input in a displayed visual representation, for example, by selecting a region within the visual representation and then performing an editing operation on audio data corresponding to the selected region.

In some implementations, the audio editing interface includes a volume control (e.g., a "louder" button, a menu item, or other graphical user interface control) for incrementally adjusting the volume of the audio data. In some implementations, the volume control increases perceived volume by a discrete amount with each user selection (e.g., a predefined increase with each button click). The volume control can automatically apply an appropriate amplification process to adjust the perceived volume (e.g., increase gain, perform dynamic range compression), as described below. As a result, a user can use a single volume control to increase the perceived volume without manually configuring one or more volume control process. In some implementations, the system plays the audio data following the performed amplification to provide feedback to the user. In some implementations, there is an undo control or "softer" button for reversing an input to increase volume or to further decrease the volume.

In response to the first input, amplification is performed on the audio data (step 108). In some implementations, the amplification increases the intensity of the audio data to a threshold level prior to clipping some portion of the audio data. For example, a normalization process can be performed on the audio data. The normalization process applies a constant amount of amplification (typically referred to as "gain") up to a threshold intensity level for all of the audio data. The threshold intensity level is predefined to avoid clipping of the audio data. For example, the threshold intensity level can be preset based on the maximum intensity level measurable by the system. Alternatively, the user can define the threshold intensity level to be used.

The normalization preserves the dynamic range between different amplitude levels by applying a constant gain across the entire audio data. This means that relationship between amplitude peaks and troughs in the amplitude waveform for the audio data remains the same. In some implementations, the audio data is first analyzed to identify the peaks in the audio waveform indicating points of maximum amplitude. The amount of gain is then applied based on the maximum amplitude in order to prevent clipping of the audio data.

In an alternative implementation, one or more prior inputs to the volume control can be received, which do not result in normalizing the audio data. For example, the prior inputs can amplify the audio data by a predefined incremental amount which results in an overall amplitude less than the maximum level resulting in clipping. Consequently, the normalization described above only occurs in response to an input that would lead to clipping of the audio data.

Figure 3:
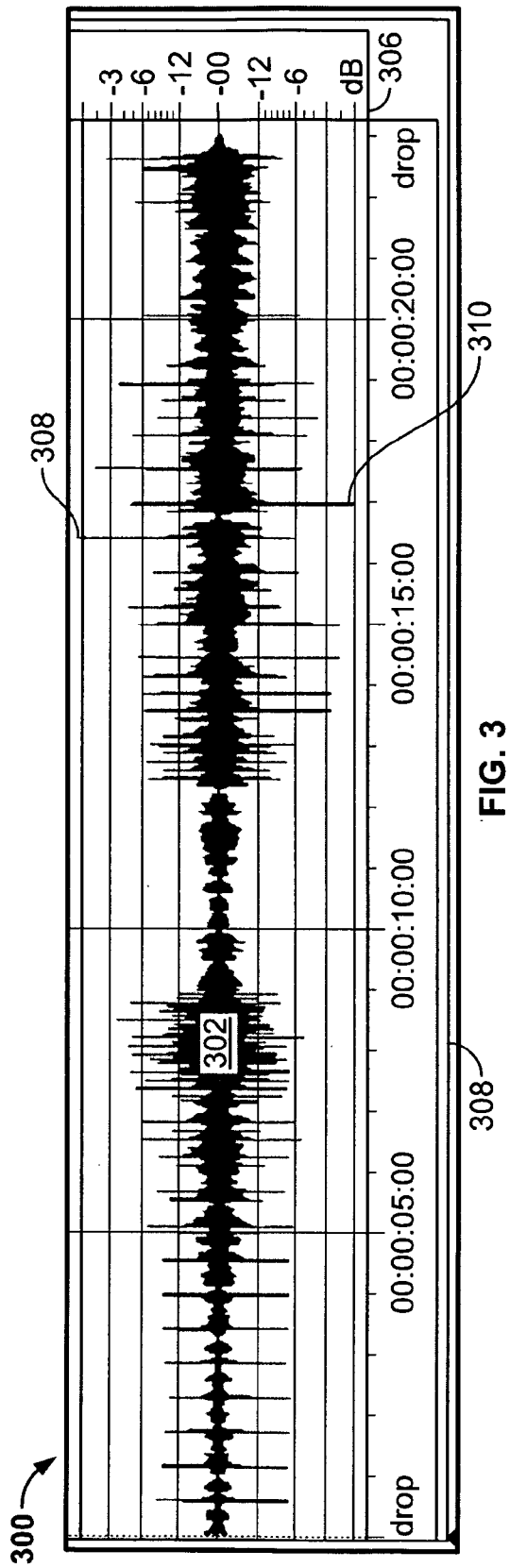
FIG. 3 shows an example display of the amplitude waveform of FIG. 2 following normalization.

FIG. 3 shows an example display 300 of the amplitude waveform 202 of FIG. 2 following normalization. As with the display 200 of FIG. 2, the display 300 shows the overall intensity of the audio data in the time-domain. In particular, the display 300 shows an amplitude waveform 302. With respect to the amplitude waveform 302, the y-axis 306 of the display 300 represents intensity. The x-axis 308 of the display 300 represents time.

In FIG. 3, the amplitude waveform 302 is a result of a normalization process applied to the amplitude waveform 202 shown in FIG. 2. The normalization process amplified the amplitude waveform 202 to increase the relative intensity of the audio data to a maximum level measurable by the system without clipping. For example, peaks 308 and 310 have an amplitude that is at a maximum intensity level, beyond which additional amplification would result in clipping of the amplitude waveform 302. Thus, normalization represents the maximum limit of the system's ability to uniformly increase the volume for the audio data without distortion. Additionally, the normalization retained the dynamics between different intensity levels in the amplitude waveform 202.

As shown in FIG. 1, the system receives a second input to the volume control to increase the volume of the audio data (step 110). In some implementations, the user selects the same volume control a second time in order to further increase the perceived volume of the audio data by an incremental amount. However, the second user input does not result in further normalization of the audio data since the maximum amplification without clipping has already been achieved. Instead, in response to the second input, the system automatically performs compression (e.g., dynamic range compression) to portions of the audio data instead of amplification (step 112). Thus, even though the same volume control was selected (e.g., clicking the same "louder" button), a different processing is performed on the audio data. Consequently, the user does not need to know how or what particular form of audio processing to perform on the audio data in order to increase volume without clipping. The system then amplifies (e.g., by normalization) the audio data following the compression (step 114). The amplification again amplifies the audio data, including the portions that were compressed. Consequently, the perceived volume of the audio data is increased.

In some implementations, the compression is dynamic range compression. During dynamic range compression, the system compresses the portions of the audio data where the respective amplitude waveform peaks exceed a threshold intensity level. The threshold intensity level is some predefined input intensity level, for example, within a particular range from the maximum intensity. The threshold level can depend on the amount of compression being applied. For example, with low compression ratios, e.g., 2:1; 4:1, a lower threshold can be used since the gain reduction applied to peaks in the audio waveform is small. However, with higher compression ratios, e.g., 10:1, a higher threshold level can also be used since the gain reduction on the high peaks is much greater. Thus, the high amplitude peaks of the audio data will be largely reduced such that the overall audio data can be amplified by a greater amount. For example with a 10:1 compression ratio, if the threshold level is −0.3 dB from the dBFS maximum, audio peaks having an intensity level beyond the threshold level are compressed by a factor of 10, while audio data below the −0.3 dB threshold level is unaltered. In some implementations, the amount of compression increases (i.e., the compression ratio increases) with incremental inputs to increase the volume of the audio data.

A low threshold alters the dynamic range of the audio data to a greater amount because the compression is active over a larger range of the audio data. In contrast, a high threshold has a smaller effect on the overall dynamic range of the audio data since a smaller fraction of the audio data will be affected. Only audio data having an amplitude exceeding the threshold level is compressed. As a result, high amplitude peaks are reduced while leaving low and mid range peaks alone. Thus, less disturbance of dynamic range results from a higher threshold for dynamic range compression. In some implementations, a dynamic range compression is used having a compression ratio of 10:1 or greater.

In other implementations, limiting is performed instead of dynamic range compression followed by amplification. Limiting reverses the compression and amplification operations of steps 112 and 114. Limiting is applied by first amplifying the audio data by a predefined amount and then compressing the resultant audio data that exceeds a specified threshold amplitude level. The compression can be aggressive, having a ratio of 10:1 or greater. Limiting can be used, for example, with audio editors using floating point mathematics, which allow the amplified values of the audio data to exceed the dynamic range of the system without losing information.

After performing compression and amplification operations, in either order, the visual representation can be updated to reflect the changes (step 116). For example, the visual representation can be adjusted to reflect the changes to the amplitude waveform following dynamic range compression and normalization operations.

Figure 4:
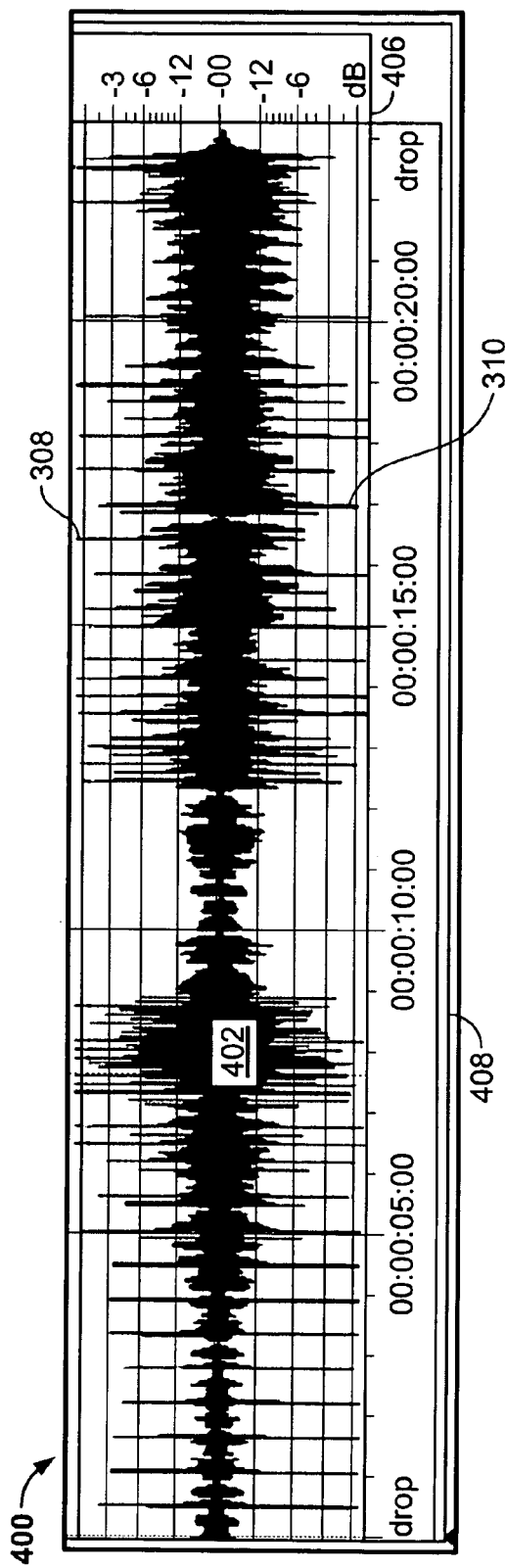
FIG. 4 shows an example display of the amplitude waveform following a first dynamic range compression process on the normalized audio data.

FIG. 4 shows an example display 400 of the amplitude waveform 302 of FIG. 3 following application of dynamic range compression and subsequent normalization. As with displays 200 and 300 of FIGS. 2 and 3, respectively, the display 400 shows the overall intensity of the audio data in the time-domain. In particular, the display 400 shows amplitude waveform 402. With respect to the amplitude waveform 402, the y-axis 406 of the display 400 represents intensity and the x-axis 408 represents time.

In FIG. 4, the amplitude waveform 402 is a result of a dynamic range compression and additional normalization processes applied to the amplitude waveform 302 shown in FIG. 3. The dynamic range compression process reduced the peaks of the amplitude waveform 302 having an intensity level beyond a threshold level (e.g. peaks 308 and 310). The audio data was then normalized to increase the overall gain, resulting in the amplitude waveform 402. The amplitude waveform 402 shows an overall increased amplitude for the audio data without clipping. Consequently, however, the portions of the audio data that had an amplitude value that was previously beyond the threshold level have a smaller difference between their amplitude peak and amplitude peaks of other portions of the amplitude waveform. For example, peaks 408 and 410 correspond to peaks 308 and 310 of FIG. 3. However, the difference in amplitude between peaks 408 and 410 and other portions of the amplitude waveform 402 has decreased. The overall amplitude of the audio data has increased due to the dynamic range compression and amplification processes. Thus, the perceived volume is increased even if some portions of the audio data have not increased or have decreased in amplitude.

As shown in FIG. 1, the system determines whether additional inputs are received (step 118). If no additional input to increase volume is received, the volume adjustment is completed (step 120). For example, the edited audio data can be saved locally, transmitted, or stored on removable media such as a compact disc. Additionally, the audio data can be further edited, played, or otherwise manipulated. For example, other editing processes can be performed on the audio data. Additionally, other visual representations of the audio data can be displayed for use in audio editing (e.g., frequency spectrogram, pan position display, phase display).

If additional inputs to the volume control to increase volume of the audio data are received (e.g., additional selection of the volume control button), the processes of compression and amplification from steps 112 and 114 repeat. Alternatively, steps 112 and 114 repeat in reverse order when limiting is performed as disclosed above. Thus, for each incremental user input, the perceived volume is increased, without clipping, by performing, for example, dynamic range compression and normalization processing to compress peaks in the audio waveform and amplify the entire waveform by a predefined amount. In some implementations, the system plays the audio data following each additional volume increasing (e.g., dynamic range compression and amplification) to provide feedback to the user.

Figure 5:
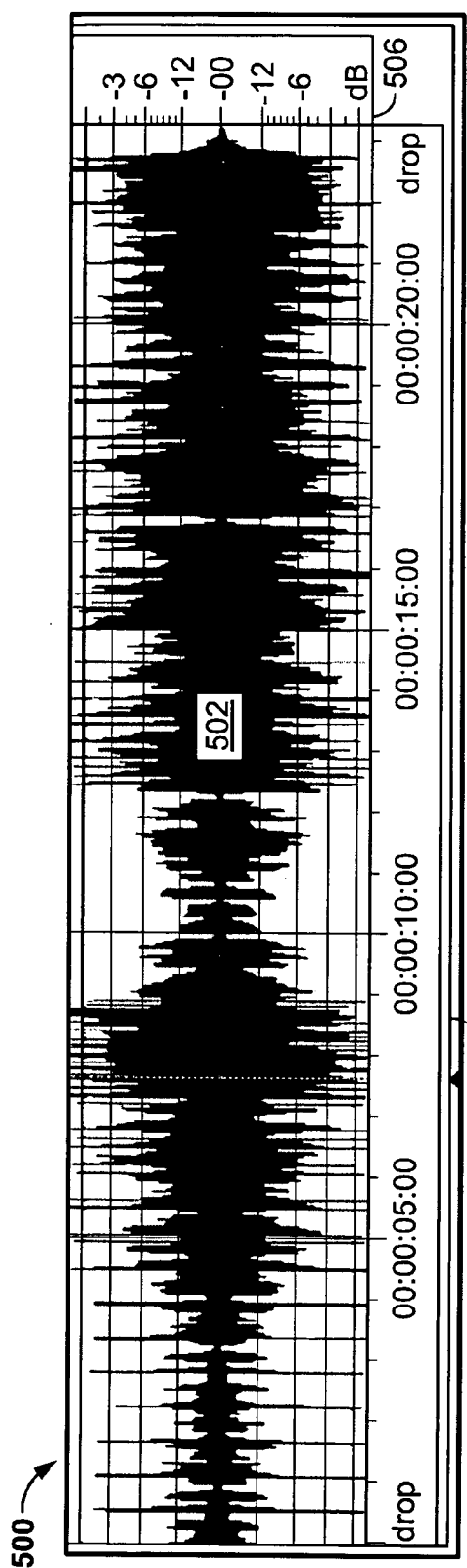
FIG. 5 shows an example display of the amplitude waveform following a second dynamic range compression process.

FIG. 5 shows an example display 500 of the amplitude waveform of FIG. 4 following additional applications of dynamic range compression and normalization. The display 500 shows the overall intensity of the audio data in the time-domain. In particular, the display 500 shows amplitude waveform 502. With respect to the amplitude waveform 502, the y-axis 506 of the display 500 represents intensity and the x-axis 508 represents time.

In FIG. 5, the amplitude waveform 502 is a result of a dynamic range compression and additional normalization processes applied to the amplitude waveform 402 shown in FIG. 4. As with the amplitude waveform 402, the perceived volume has been increased without clipping the audio data. However, the variation between the different peak levels decreases with each round of dynamic range compression because a greater portion of the overall amplitude waveform becomes subject to the dynamic range compression processing.

Figure 6:
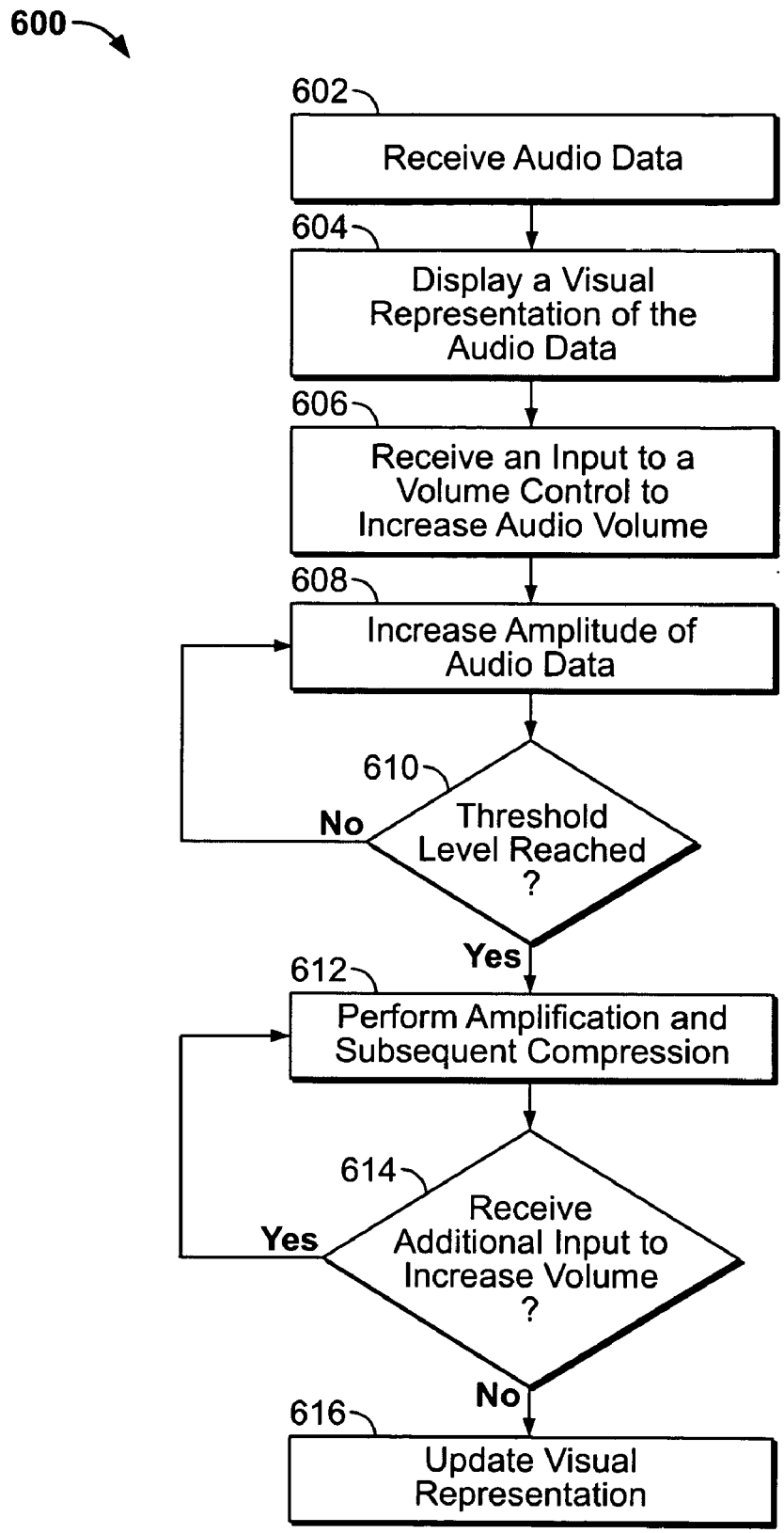
FIG. 6 shows another example process for adjusting perceived audio volume.

FIG. 6 shows an example process for adjusting perceived audio volume. As with the process 100 of FIG. 1, the system first receives audio data (step 602). The audio data is received, for example, as part of an audio file. The system then displays a visual representation of the audio data (step 604) e.g., an amplitude waveform.

The system receives an input (e.g., a user input) to a volume control to gradually increase audio volume (step 606). Instead of the volume control above that provides incremental volume increases in discrete amounts, a volume control can be used to continuously increase the volume according to user input. For example, the volume control can be a slider control where the user can drag the slider (e.g., using a cursor on a graphical user interface) to increase the volume continuously to some maximum level provided by the volume control.

As the user provides input to the volume control to increase volume of the audio data, the system increases the amplitude to a threshold value. The amplitude increase is gradually performed corresponding to the user input. For example, a small movement in a slider control increases the amplitude by a small amount. However, greater movement of the slider control increases the amplitude by a greater amount. A particular algorithm relates the slider displacement with an amount of amplification to provide a particular amplification (e.g., based on a linear, logarithmic, or other relationship).

The amplitude can initially be increased by a simple overall amplitude increase (e.g., a constant gain applied across the audio data) until a threshold intensity level is reached or until the input to the volume control ends. The system determines whether or not the threshold level has been reached (step 610). For example, the system can analyze the amplitude waveform of the audio data to identify a maximum gain that can be applied without clipping.

If the threshold level has been reached, the system switches from a constant gain increase to performing amplification followed by compression (e.g., a limiting process as described above) (step 612). Thus, the audio data can be amplified by a predefined amount and then the amplitude peaks of the audio data beyond a threshold level are compressed, thereby preventing clipping of the audio data. In other implementations, the operations are reversed; dynamic range compression is performed on the amplitude peaks beyond the threshold level and amplification is applied to the entire audio data following the compression. Therefore, with either processing, the perceived volume of the audio data continues to increase with the volume control input. If the threshold level has not been reached, the system continues to increase amplitude linearly across the audio data.

The system determines whether additional input is received to increase the volume of the audio data (step 614). If further input is received, the system continues to perform compression and amplification as above. In some implementations, the user can undo one or more volume increases, for example, using an undo control. The system can temporarily store the audio data between incremental edits in order to restore a prior version of the audio data. In some implementations, the user can reverse direction of the slider control in order to reduce amplification, e.g., linearly.

If no further input is received, the visual representation is updated to illustrate the amplitude changes (e.g., using an amplitude waveform) (step 616). In some implementations, the visual representation is updated substantially in real-time to provide visual feedback to of the amplitude changes contemporaneous with input to the volume control. As a result, a user can receive visual feedback of the amplitude modifications resulting from the input to the volume control.

In some implementations, the volume control applies an amplification or dynamic range compression process to the audio data as a whole. In an alternative implementation, the volume control can be applied to a selected region of the audio data such that the amplification or other volume control processes are only applied to the audio data of the selected region. A smoothing function can be applied at the boundary between the audio data in the selected region and the remaining audio data following the volume control process.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer-readable medium. The propagated signal is an artificially generated signal, e.g., a machine-generated electrical, optical, or electromagnetic signal, that is generated to encode information for transmission to suitable receiver apparatus for execution by a computer. The computer-readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:
1. A method comprising:
receiving digital audio data;
receiving a first input to a volume control to increase a volume of the audio data;
amplifying, using one or more processors, the audio data in response to the first input, where the amplifying includes increasing a gain of the audio data by a constant amount below a threshold intensity level for all of the audio data to prevent clipping of the audio data;

receiving one or more subsequent inputs to the volume control to increase a volume of the amplified audio data; and determining that the increase in the volume of the amplified audio data for a subsequent input of the one or more subsequent inputs would result in clipping and when the increase in the volume of the amplified audio data would result in clipping, performing both compression and amplification of the audio data in response to the subsequent input, where performing compression includes compressing portions of the audio data that would be clipped as a result of increasing the volume of the amplified audio data and not compressing the remaining portions of the audio data.

2. The method of claim 1, where the performed compression is dynamic range compression, the dynamic range compression including compressing portions of the audio data exceeding a threshold amplitude level and not compressing the remaining portions of the audio data and the amplification amplifies the audio data following compression without clipping the audio data.

3. The method of claim 1 where the combination of compression and amplification operations comprise limiting, where limiting includes amplifying the audio data and then compressing portions of the audio data exceeding a threshold amplitude level and not compressing the remaining portions of the audio data.

4. The method of claim 1, where the volume control is a single button of an audio editing interface.

5. The method of claim 1, where amplifying the audio data in response to the first input includes normalizing the audio data including amplifying the audio data to a predetermined threshold level without clipping.

6. The method of claim 5, where the predetermined level is a maximum amplification that can be achieved without clipping.

7. The method of claim 1, further comprising:
scanning the audio data prior to performing normalization to identify amplitude peaks in the audio data.

8. The method of claim 1, further comprising:
providing a user interface, the user interface displaying a visual representation of the audio data and including one or more controls allowing user manipulation of the audio data.

9. The method of claim 8, further comprising:
updating the visual representation of the audio data following each input to reflect the amplified audio data.

10. The method of claim 8, where the displayed visual representation is an amplitude waveform.

11. A method comprising:
receiving digital audio data; and
receiving an input to adjust the amplitude of the audio data, where in response to the input:
amplifying, using one or more processors, the audio data, where the amplifying includes uniformly increasing a gain of the audio data relative to a threshold amplitude level that would result in clipping of the audio data,
determining that the threshold amplitude level of the audio data has been reached by a portion of the audio data as a result of the amplifying, and
in response to the determining, performing limiting, the limiting including amplifying the audio data by a predefined amount and compressing portions of the audio data exceeding the threshold amplitude level and not compressing the remaining portions of the audio data.

12. The method of claim 11, where the user input includes adjusting a sliding volume control in an audio editing interface.

13. The method of claim 11, where determining when a threshold amplitude level is reached comprises monitoring peak amplitude levels of the audio data for a maximum amplitude level.

14. The method of claim 13, where the maximum amplitude level is a maximum amplification that can be achieved without clipping.

15. The method of claim 11, where the change from amplification to limiting is automatically performed in response to a user input that would result in clipped audio data.

16. A computer program product, encoded on a non-transitory computer-readable medium, operable to cause data processing apparatus to perform operations comprising:
receiving digital audio data;
receiving a first input to a volume control to increase a volume of the audio data;
amplifying the audio data in response to the first input, where the amplifying includes increasing a gain of the audio data by a constant amount below a threshold intensity level for all of the audio data to prevent clipping of the audio data;
receiving one or more subsequent inputs to the volume control to increase a volume of the amplified audio data; and
determining that the increase in the volume of the amplified audio data for a subsequent input of the one or more subsequent inputs would result in clipping and when the increase in the volume of the amplified audio data would result in clipping, performing both compression and amplification of the audio data in response to the subsequent input, where performing compression includes compressing portions of the audio data that would be clipped as a result of increasing the volume of the amplified audio data and not compressing the remaining portions of the audio data.

17. The computer program product of claim 16, where the performed compression is dynamic range compression, the dynamic range compression including compressing portions of the audio data exceeding a threshold amplitude level and not compressing the remaining portions of the audio data and the amplification amplifies the audio data following compression without clipping the audio data.

18. The computer program product of claim 16, where the combination of compression and amplification operations comprise limiting, where limiting includes amplifying the audio data and then compressing portions of the audio data exceeding a threshold amplitude level and not compressing the remaining portions of the audio data.

19. The computer program product of claim 16, where the volume control is a single button of an audio editing interface.

20. The computer program product of claim 16, where amplifying the audio data in response to the first input includes normalizing the audio data including amplifying the audio data to a predetermined threshold level without clipping.

21. The computer program product of claim 20, where the predetermined level is a maximum amplification that can be achieved without clipping.

22. The computer program product of claim 16, further comprising:
scanning the audio data prior to performing normalization to identify amplitude peaks in the audio data.

23. The computer program product of claim 16, further comprising:
providing a user interface, the user interface displaying a visual representation of the audio data and including one or more controls allowing user manipulation of the audio data.

24. The computer program product of claim 23, further comprising:
updating the visual representation of the audio data following each input to reflect the amplified audio data.

25. A computer program product, encoded on a non-transitory computer-readable medium, operable to cause data processing apparatus to perform operations comprising:
receiving digital audio data;
receiving an input to adjust the amplitude of the audio data, where in response to the user input:
amplifying the audio data, where the amplifying includes uniformly increasing a gain of the audio data relative to a threshold amplitude level that would result in clipping of the audio data,
determining that the threshold amplitude level of the audio data has been reached by a portion of the audio data as a result of the amplifying, and
in response to the determining, performing limiting, the limiting including amplifying the audio data by a predefined amount and compressing portions of the audio data exceeding the threshold amplitude level and not compressing the remaining portions of the audio data.

26. A system comprising:
a user interface device; and
one or more computers operable to interact with the user interface device and to:
receive digital audio data;
receive a first input to a volume control to increase a volume of the audio data;
amplify the audio data in response to the first input, where the amplifying includes increasing a gain of the audio data by a constant amount below a threshold intensity level for all of the audio data to prevent clipping of the audio data;
receive one or more subsequent inputs to the volume control to increase a volume of the amplified audio data; and
determine that the increase in the volume of the amplified audio data for a subsequent input of the one or more subsequent inputs would result in clipping and when the increase in the volume of the amplified audio data would result in clipping, perform both compression and amplification of the audio data in response to the subsequent input, where performing compression includes compressing portions of the audio data that would be clipped as a result of increasing the volume of the amplified audio data and not compressing the remaining portions of the audio data.

27. The system of claim 26, wherein the one or more computers comprise a server operable to interact with the user interface device through a data communication network, and the user interface device is operable to interact with the server as a client.

28. The system of claim 27, wherein the user interface device comprises a personal computer running a web browser or a mobile telephone running a WAP browser.

29. The system of claim 26, wherein the one or more computers comprises one personal computer, and the personal computer comprises the user interface device.

* * * * *